(12) United States Patent
Chen et al.

(10) Patent No.: US 6,261,905 B1
(45) Date of Patent: Jul. 17, 2001

(54) FLASH MEMORY STRUCTURE WITH STACKING GATE FORMED USING DAMASCENE-LIKE STRUCTURE

(75) Inventors: Jong Chen, Taipei; Chrong-Jong Lin, Hsin-Tien; Hung-Der Su, Kao-Hsiung; Wen-Ting Chu, Kaohsiung, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/560,625

(22) Filed: Apr. 28, 2000

(51) Int. Cl.$^7$ .................................................. H01L 21/8247
(52) U.S. Cl. ........................ 438/264; 438/296; 438/633
(58) Field of Search ................................ 438/257, 259, 438/264, 296, 593, 594, 633

(56) References Cited

U.S. PATENT DOCUMENTS

| | | | |
|---|---|---|---|
| 5,032,881 | 7/1991 | Sardo et al. | 357/23.5 |
| 5,643,813 | 7/1997 | Acocella et al. | 437/43 |
| 5,707,897 | 1/1998 | Lee et al. | 438/257 |
| 5,731,242 | * 3/1998 | Parat et al. | 438/593 |
| 5,753,525 | 5/1998 | Hsu et al. | 437/43 |
| 5,767,005 | 6/1998 | Doan et al. | 438/593 |
| 6,060,358 | * 5/2000 | Bracchitta et al. | 438/296 |
| 6,080,624 | * 6/2000 | Kamiya et al. | 438/257 |

FOREIGN PATENT DOCUMENTS 12-164714 * 6/2000 (JP) .

* cited by examiner

Primary Examiner—Chandra Chaudhari
(74) Attorney, Agent, or Firm—George O'Saile; Stephen B. Ackerman; Sevgin Oktay (57) ABSTRACT

A flash memory cell and the making thereof is disclosed where the cell has a damascene-like stacked gate. The stacked gate is formed not by blanket depositing a first polysilicon layer and then subtractively etching to form a floating gate followed by the depositing of a second polysilicon layer separated by an intervening inter-gate dielectric layer over the floating gate. On the contrary, a trench is formed in a nitride layer formed over a substrate using a modified damascene process. The first polysilicon layer is conformally deposited into the damascene-like trench to form the floating gate of the disclosed cell. Then, a layer of inter-gate dielectric layer is formed over the first polysilicon layer in the trench, followed by the forming of a second polysilicon layer over the dielectric layer, thus forming the damascene-like stacked gate of this invention. The disclosed method alleviates the problem of having poly residues resulting from defects caused by etching the conventionally deposited polysilicon layer. Furthermore, etching over active region can also cause damage to the underlying substrate, which is not the case here. In addition, the method enables the incorporation of the curved structure of the floating gate of this invention into the area that increases the coupling ratio of the flash memory cell.

22 Claims, 8 Drawing Sheets

FLASH MEMORY STRUCTURE WITH STACKING GATE FORMED USING DAMASCENE-LIKE STRUCTURE

BACKGROUND OF THE INVENTION (1) Field of the Invention

The present invention relates to the manufacture of semiconductor memory devices in general, and in particular, to the fabrication of a flash memory cell using damascene-like structures.

(2) Description of the Related Art

Figure 1A:
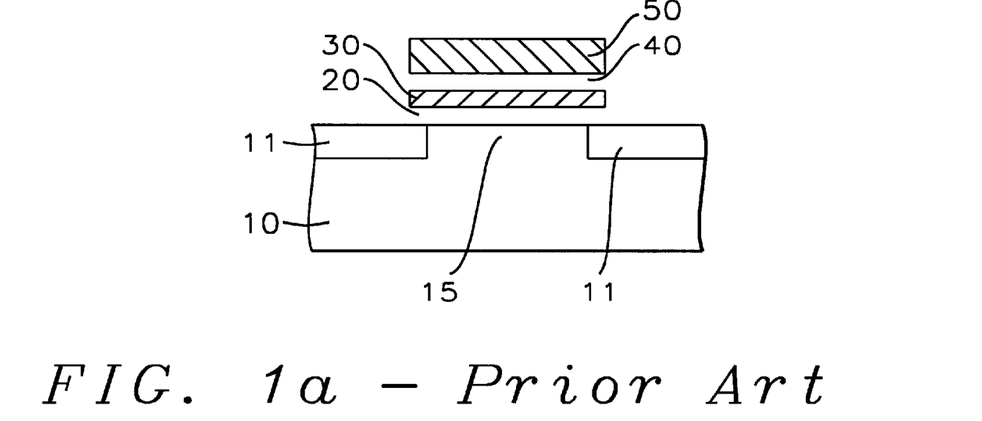
FIG. 1a shows a stacked gate memory cell of prior art.

A conventional memory cell, such as the electrically programmable read-only memory (EPROM) cell, usually comprises a single field effect transistor (FET) having a stacked floating gate and a control gate. A related stacked memory cell is shown in FIG. 1a, where source/drain regions (11) separated by channel area (15) are formed in semiconductor substrate (10). As is well-known in the art, floating gate (30) and control gate (50) are typically formed by patterning two conductively doped polysilicon layers, and the floating gate is completely surrounded by an electrically isolating dielectric, hence, its name. However, because the floating gate is formed by etching a first polysilicon layer over a thin gate oxide layer (20) grown on channel area (15) of the FET, there is usually damage done to the underlying active region of the cell. In addition, there is the problem of poly residue after the etching, which raises reliability issues. It is common practice to use highly selective etch to prevent the residue, but that also has the attendant problems of eroding and distorting the gate geometries which in turn affect the gate coupling ratio. It is disclosed in the embodiments of the present invention a method of forming a stacked gate of a flash memory cell without damaging the active regions, and also with well-defined gate profile. This will be accomplished by applying a modified damascene process to the fabrication of a flash memory cell. As it will be described later, in a damascene process, metal is deposited in a channel that has already been formed in an insulator, rather than depositing the material first on the insulator and defining, or, shaping it later by etching, as is customarily done. In the present invention, gate material, such as polysilicon, and not metal, is deposited into a damascene structure that will have been already formed.

As seen in FIG. 1a, floating gate (30) is separated from the substrate and the control gate by the dielectric layers (20) and (40), respectively. Control gate (50) is formed on the dielectric insulating layer (40) aligned over the floating gate, and is accessed by the peripheral circuits on the EPROM chip via word lines that interconnect the FET control gats. The control gate and floating gate are capacitively coupled through the thin dielectric layer.

In an array, the selected cells are coded (programmed) by applying a sufficiently high voltage potential between the control gate and the FET drain, resulting in the injection of hot channel electrons in the substrate through the thin gate oxide into the floating gate. Since the floating gate is well insulated, the accumulated charge is retained for an indefinite period of time thereby providing an array of coded non-volatile memory cells.

The charge stored on the floating gate shifts the threshold voltage, $V_t$, on the programmed FET (charged FET), while the $V_t$ on the uncharged (non-programmed FET) is not shifted in value. When the memory cell on the EPROM chip is selected by the addressed decode circuit on the periphery of the EPROM chip, and a gate voltage $V_g$ is applied to the control gate having a value between the $V_t$ of the non-programmed and programmed FETs, the non-programmed FET turns on and the programmed FET does not. The conductive state (on or off) of the FET channel is then interpreted as digital binary ones or zeros.

Typically, the stored data (electrical charge) on the EPROM chip is erased by removing the chip from the equipment, and exposing it for 20 to 30 minutes to ultraviolet radiation to generate electron-hole pairs in the gate oxide and to thereby provide an electrical path to discharge the floating gate. By incorporating these floating gates in a circuit with the proper circuit design, the floating gates can be discharged (erased) by reversing the polarity of the programming voltage, allowing for the fabrication of electrically erasable programmable read-only memory (EEPROMs). And further, by providing for the simultaneous erasure of all the coded memory cells, flash EEPROMs can also be fabricated.

The double gate in the FET patterned from the two doped polysilicon layers represents a capacitive divider. It is desirable to have the threshold voltage $V_t$ as low as possible for higher density EPROM circuits. Thus, for even an uncharged floating gate, the FET appears to have a higher threshold voltage $V_t$ as viewed from the control gate than an equivalent FET would have without the floating gate. For example, a gate voltage of $V_2$ on control gate (50) of FIG. 1a results in a low voltage $V_1$ on floating gate (30) having a value of $V_1 = K \times V_2$, where $K = C_2/(C_1 + C_2)$ is the capacitive coupling constant, $C_2$ is the capacitance between the control gate and the floating gate, and $C_1$ is the capacitance between the floating gate and conducting channel (15) of the FET. To minimize the operating and programming voltages, it is desirable to have the capacitive coupling between the control gate and floating gate as large as possible, therefore $C_2$ should be as large as possible.

Unfortunately, during the further downscaling of the minimum feature sizes on the EPROM integrate circuit to achieve much higher densities required for future EPROM chips having a reasonable size, it is necessary to reduce the area that the memory cell occupies on the chip. However, this necessarily reduces the area of the gate electrodes, and thereby reduces the capacitive coupling ratio K between the floating and control gates on a conventional prior art EPROM. This reduction in area is exacerbated by the conventional methods of forming the stacked gates, namely, by first depositing polysilicon layers and etching them. The etching usually distorts and erodes the shape and size of the intended gates. This problem can be alleviated by applying a modified damascene process as disclosed in the present invention.

The term 'damascene' is derived from a form of inlaid metal jewelry first seen in the city of Damascus. In the context of integrated circuits it implies a patterned layer imbedded on and in another layer such that the top surfaces of the two layers are coplanar. Thus, in semiconductor manufacturing, grooves and holes in appropriate locations in the grooves are formed in an insulating material by etching, which are then filled with metal. Metal in grooves form the horizontal metal line interconnects while the metal in the underlying holes form the vertical connections to the layers of metal interconnects formed in the previous damascene structure.

Thus, in a single damascene semiconductor manufacturing process, incisions, or grooves, are formed in an insulating layer and filled with metal to form conductive lines. Dual damascene takes the process one step further in that, in addition to forming the grooves of a single damascene, hole openings are also formed at appropriate places in the groove further into the insulating layer. The resulting composite structure of grooves and holes are filled with metal. The process is repeated as many times as required to form the multi-level interconnections between metal lines and the holes formed therebetween.

Figure 2A:
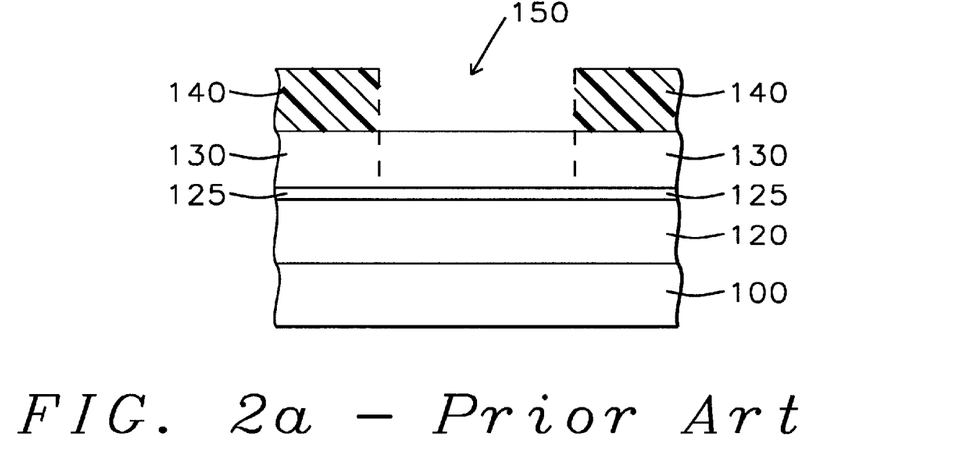
FIGS. 2a–2b show the forming of a damascene structure in a semiconductor substrate by first forming a line groove and then a contact hole in insulating layers separated by an etch stop layer, according to prior art.
Figure 2B:
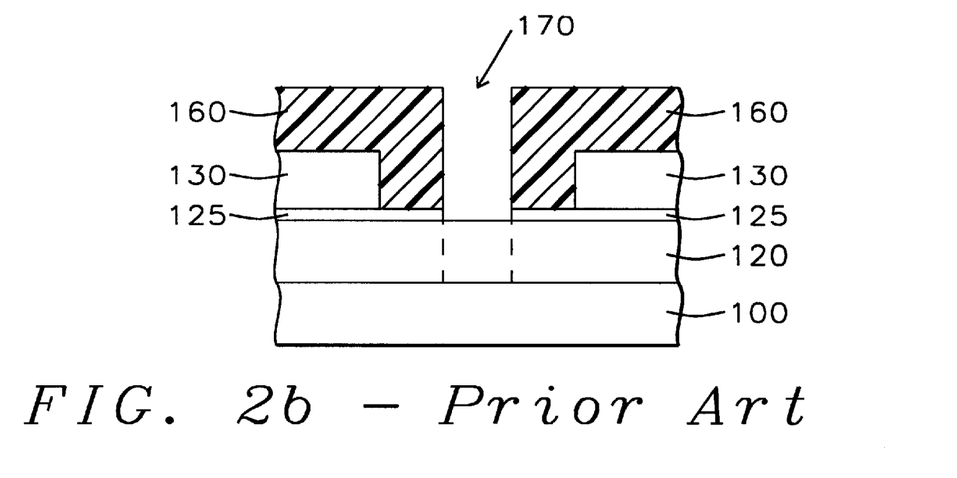

In one approach for a dual damascene process, two insulating layers (120) and (130) are formed on a substrate (100) with an intervening etch-stop layer (125) as shown in FIG. 2a. A desired trench or groove pattern (150) is first etched into the upper insulating material (130), as shown in FIG. 2a, using conventional photolithographic methods and photoresist (140). The etching stops on etch-stop layer (125). Next, a second photoresist layer (160) is formed over the substrate, thus filling the groove opening (150), and patterned with hole opening (170), as shown in FIG. 2b. The hole pattern is then etched into the lower insulating layer (120), thus forming the dual damascene structure.

Figure 2C:
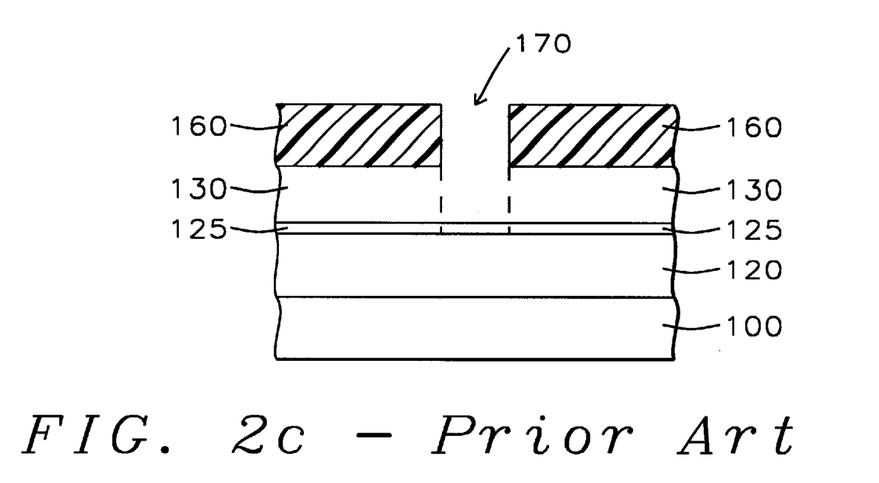
FIGS. 2c–2d show the forming of a damascene structure in a semiconductor substrate by first forming a contact hole and then a line groove in insulating layers separated by an etch stop layer, according to prior art.
Figure 2D:
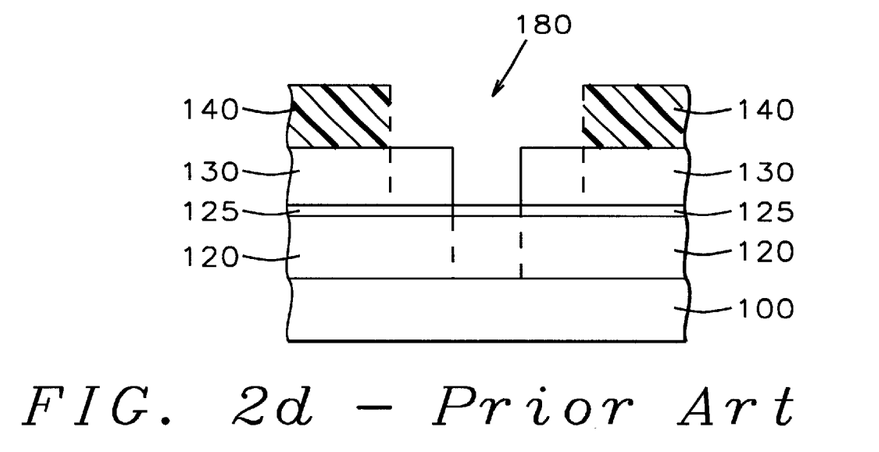
Figure 2E:
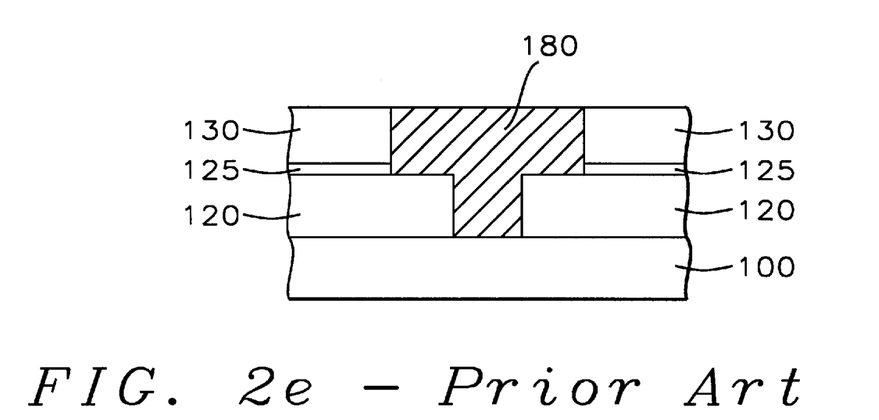
FIG. 2e is a cross section of a semiconductor substrate showing the forming of a damascene structure by methods shown in FIGS. 2a–2d, according to prior art.

Or, the order in which the groove and the hole are formed can be reversed. Thus, the upper insulating layer (130) is first etched, or patterned, with hole (170), as shown in FIG. 2c. The hole pattern is also formed into etch-stop layer (125). Then, the upper layer is etched to form groove (150) while at the same time the etching transfers the hole pattern in the etch-stop layer into lower insulation layer (120), as shown in FIG. 2d. It will be noted that the etch-stop layer stops the etching of the groove into the lower insulation layer. After the completion of the thusly formed dual damascene structure, both the hole opening and groove opening are filled with metal (180), and any excess material on the surface of the substrate is removed by chemical mechanical polishing, as seen in FIG. 2e.

It will be apparent to those skilled in the art that by forming the grooves and the holes and filling them with metal will yield more precisely formed conductive lines and contacts, and also, the problem of residue will not be an issue as in much as there is no metal etching involved. It will be shown later in the embodiments of the present invention a method of utilizing a modified damascene process in the forming of polysilicon gates in EEPROM cells with the attendant gain in capacitive coupling between the control gate and the floating gate.

Lee in U.S. Pat. No. 5,707,897 also proposes a method of forming non-volatile memory cells on EPROM devices having enhanced capacitive coupling between the control gate and the floating gate. The array of memory cells consists of a single FET having an additional floating gate. The FET is formed in a well etched into an insulating layer on the substrate surface. After forming the FET gate oxide, a polysilicon layer is patterned to form a trench-like floating ate with increased capacitive coupling. An interlevel dielectric layer is deposited. A second polysilicon layer is deposited in the well and chemical-mechanical polished back to form the control gate. The insulating layer having the wells is selectively removed.

Lightly doped source/drain areas, self-aligned to the FET gate electrodes, are implanted and after forming sidewall spacers on the gate electrodes, source/drain contacts and a buried bit lines are formed by a second implant. An insulating layer is deposited over the array of FETs having contact openings to the FET control gates. Another polysilicon layer is deposited and patterned to form the word lines. The word lines and buried bit lines are connected to the peripheral circuits to complete the EPROM chip.

Hsu, et al., of U.S. Pat. No. 5,753,525 also disclose a method of making an EEPROM cell with improved coupling ratio. The method includes forming a tunnel oxide layer on a wafer and forming floating gates on the tunnel oxide layer with the floating gate having sidewalls. Isolation regions are formed adjacent the sidewalls. A conformal ONO layer of dielectric is formed on the floating gate and sidewalls, using chemical vapor deposition (CVD). Next, a selective etch material layer is deposited on the wafer over the conformal dielectric layer. A polish stop layer is deposited on the wafer over the selective etch material layer to define an upper polishing surface above the floating gate. The exposed polish stop layer and underlying selective etch material are removed by depositing an oxide layer on the polish stop layer and then polishing the deposited layer coplanar with the polish stop layer which is an upper polishing surface above the floating gates. Exposed portions of the polish stop layer are removed to expose the selective etch layer above the floating gates and above sidewall regions adjacent the sidewalls. Then, the exposed selective etch layer is removed, exposing the conformal dielectric layer. Finally, a control gate is formed by depositing a control gate layer above the floating gate and within the sidewall region and patterning the control gate layer. The patterned control gates extend over the floating gate and along the floating gate sidewalls. The control gate-floating gate capacitor area includes the floating gate sidewalls.

On the other hand, Doan, et al., of U.S. Pat. No. 5,767,005 disclose a method for forming a floating gate semiconductor device by depositing a conductive layer into a recess over gate oxide formed on a substrate. The conductive layer is then chemically mechanically planarized to an endpoint of the isolation layer so that the entire conductive layer except material in the recess and on the gate oxide is removed. A control gate is then formed over an insulator deposited on the floating gate. An asymmetric virtual ground EPROM cell is shown in U.S. Pat. No. 5,032,881 by Sardo, et al. The cell is a virtual ground cell in that there are no fixed connections in the array to ground potential. A method of improving the packing density of flash memories is described by Acocella in U.S. Pat. No. 5,643,813. This is accomplished by confining floating gate between regions that are planarized, thus avoiding severe topology that would otherwise exist.

In the present invention, taking advantage of the disclosed modified damascene process, the curved topology over the isolation regions are in fact exploited to increase the coupling ratio between the control gate and floating gate. Furthermore, the integrity of the stacked gate is preserved. Finally, eliminating the conventional etching step of the polysilicon layers used for the gates circumvents the problem of poly residues, as disclosed in the embodiments of the instant invention.

SUMMARY OF THE INVENTION

It is therefore an object of the present invention to provide a method of forming a flash memory cell having a damascene-like stacked gate.

It is another object of this invention to provide a method of alleviating the problem of having poly residues in forming a stacked gate in a memory cell.

It is yet another object of the present invention to provide a method of increasing the coupling ratio of a memory cell by incorporating the curvature of the floating gate into the coupling area of the cell.

These objects are accomplished by providing a semiconductor; forming field oxide or shallow trench isolation (STI) within and on said substrate; forming tunnel oxide layer over said substrate including over said (STI); forming nitride layer over said tunnel oxide layer; forming a damascene-like trench in said nitride layer; forming first polysilicon layer over said substrate including over said damascene-like trench; performing chemical-mechanical polishing (CMP) of said first polysilicon layer; forming poly-oxide over said first polysilicon layer over said stacked gate regions; removing said poly-oxide layer over said first polysilicon layer; patterning said first polysilicon layer to form a floating gate of said flash memory cell; forming an inter-poly dielectric layer over said substrate including said floating gate; forming a second polysilicon layer over said inter-poly dielectric layer to form a control gate of said flash memory cell; performing chemical-mechanical polishing (CMP) of said second polysilicon layer until said nitride layer is reached; and removing said nitride layer.

BRIEF DESCRIPTION OF THE DRAWINGS

FIG. 3b is a partial cross section of a semiconductor showing the forming of a nitride layer over the substrate of FIG. 3a.

DESCRIPTION OF THE PREFERRED EMBODIMENTS

Referring now the drawings, in particular to FIGS. 3a–3f, and the companion FIGS. 4a–4d, there is shown a method of forming a flash memory cell having damascene-like stacked gate. The method employs a modified damascene process where no metal is used. Namely, the stacked gate is formed not by the conventional method of blanket depositing a first polysilicon layer and then subtractively etching to form a floating gate followed by the depositing of a second polysilicon layer separated by an intervening inter-gate dielectric layer over the floating gate. On the contrary, a trench is formed in a nitride layer formed over a substrate using a modified damascene process. The first polysilicon layer is conformally deposited into the damascene-like trench to form the floating gate of the disclosed cell. Then, a layer of inter-gate dielectric layer is formed over the first polysilicon layer in the trench, followed by the forming of a second polysilicon layer over the dielectric layer, thus forming the damascene-like stacked gate of this invention. The disclosed method alleviates the problem of having poly residues resulting from defects caused by etching the conventionally deposited polysilicon layer. Furthermore, etching over active region can also cause damage to the underlying substrate, which is not the case here. In addition, the method enables the incorporation of the curved structure of the floating gate of this invention into the area that increases the coupling ratio of the flash memory cell.

FIGS. 3a–3f show the process steps of forming the flash memory cell of the present invention. The companion FIGS. 4a–4d are top views of the substrate used for illustrating the process steps in order to give a better understanding of the modified damascene structure.

Figure 3A:
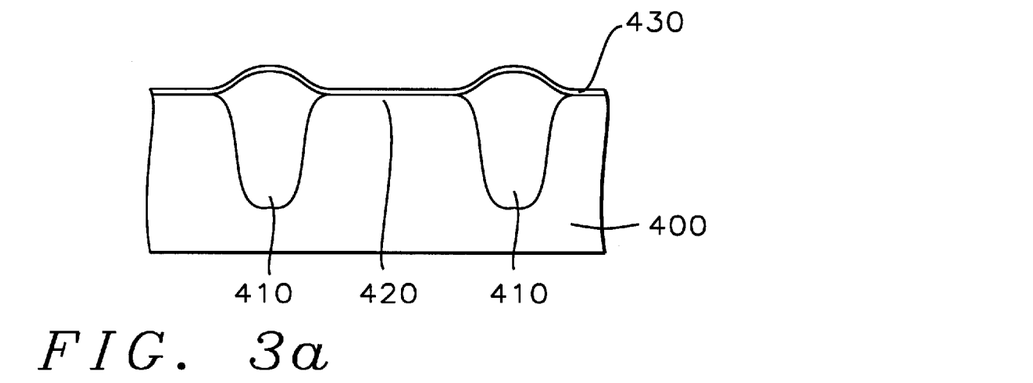
FIG. 3a is a partial cross section of a semiconductor showing the forming of shallow trench isolation and pad or tunnel oxide, according to the present invention.

More specifically, in FIG. 3a, a semiconductor substrate (400), preferably silicon, is provided where active and passive regions are defined using conventional methods. For example, active regions (420) can be formed within areas defined by field oxides or trench isolation. It is preferred that shallow trench isolation (STI) (410) be used as the more pronounced curvature of the STI (in comparison with that of the conventional local oxidation of silicon (LOCOS)) will be used to advantage in incorporating the increased area due to the curvature into the area over which a floating gate will be formed at a later step. This will result an increase in the coupling ratio, as it will be apparent to those skilled in the art.

Substrate (400) shown in FIG. 3a is next covered by a layer of tunnel oxide (430), preferably having a thickness between about 20 to 200 Å. Tunnel oxide can be formed by an atmospheric or low pressure chemical vapor deposition process as is known. The preferred method of forming the tunnel oxide is by thermal oxidation in dry oxygen carried out in an oxidation furnace in a temperature range between about 600 to 1200° C. Alternatively, other oxidation methods can be used, such as oxidation in a dry oxygen and anhydrous hydrogen chloride in an atmospheric or low pressure environment, or low temperature, high-pressure, and the like.

Figure 3B:
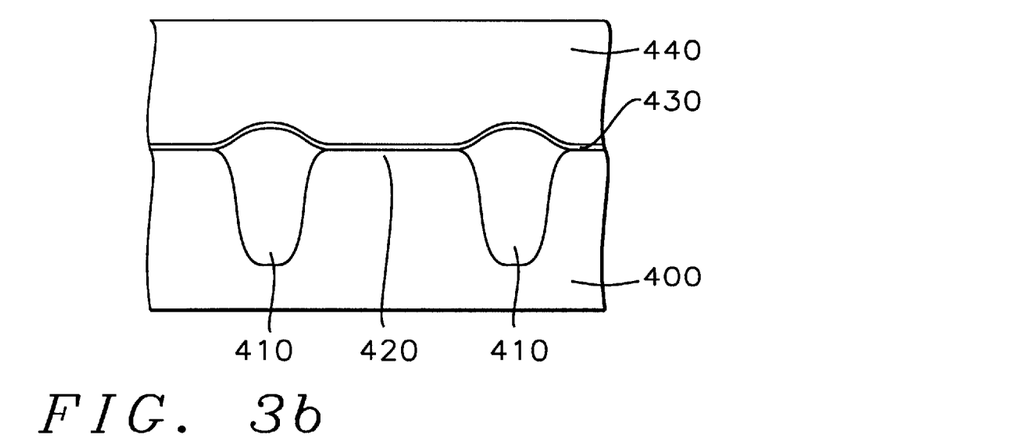

The process step above is followed by the forming of nitride layer (440) over oxide layer (430), including over STI, as shown in FIG. 3b. It is preferred that nitride layer (440) is formed by reacting dichlorosilane (SiCl2H2), or silane (SiH4), at a temperature between about 700 to 900° C., and to a thickness between about 1000 to 5000 Å.

As an important step of the disclosed process, nitride layer (440) is next patterned in strips to define damascene-like trench regions where the damascene-like stacked gate of the invention will be formed. Patterning is performed through conventional techniques employing photoresist as a mask for the desired patterns. It is important, however, that the patterning of this damascene-like trench is accomplished in a high-density plasma (HDP) nitride etcher with etch recipe comprising gases $O_2$, $SO_2$, $CF_4$ and He. The preferred depth of the trench is between about 1000 to 5000 Å. Also, the selectivity of the etchant to the underlying oxide layer (430) must be high, namely, between about 10 to 20. As a key aspect of the present invention, the oxide layer protects the substrate from any damage during the etching of the damascene-like trench.

Figure 3C:
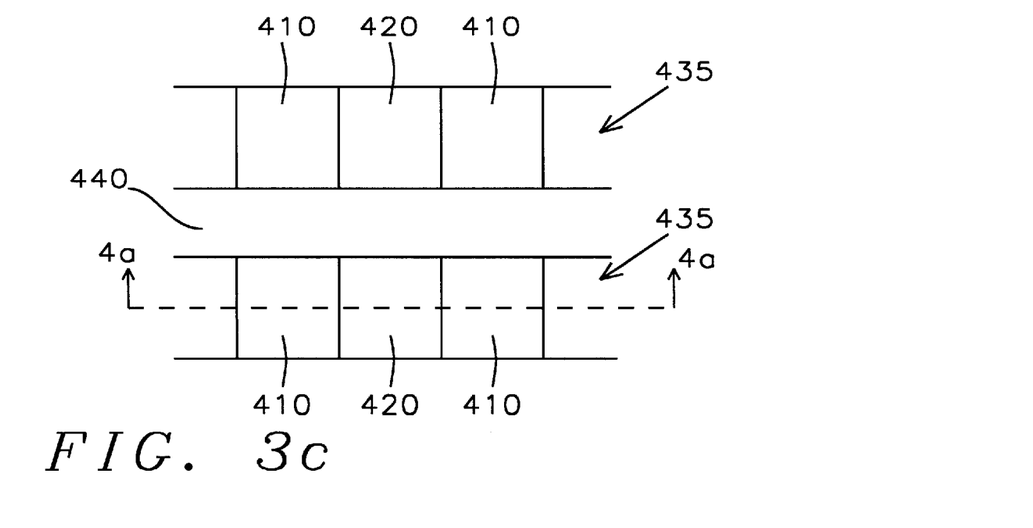
FIG. 3c is a top view of a semiconductor substrate showing the patterning of nitride layer of FIG. 3b, according to the present invention.
Figure 3D:
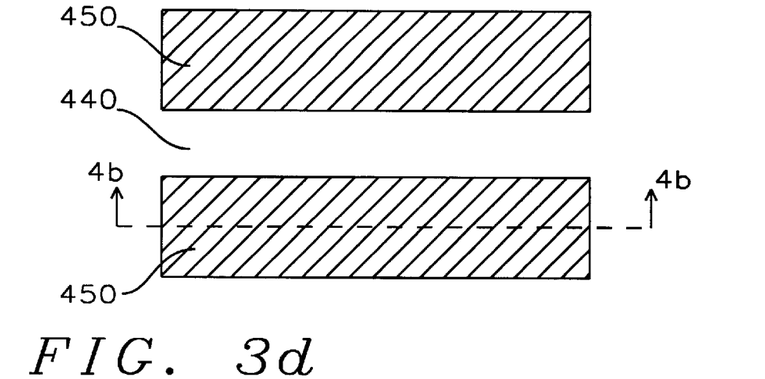
FIG. 3d is a top view of a semiconductor substrate showing the forming and chemical-mechanical polishing of the first polysilicon layer formed over the substrate of FIG. 3c, according to the present invention.
Figure 4A:
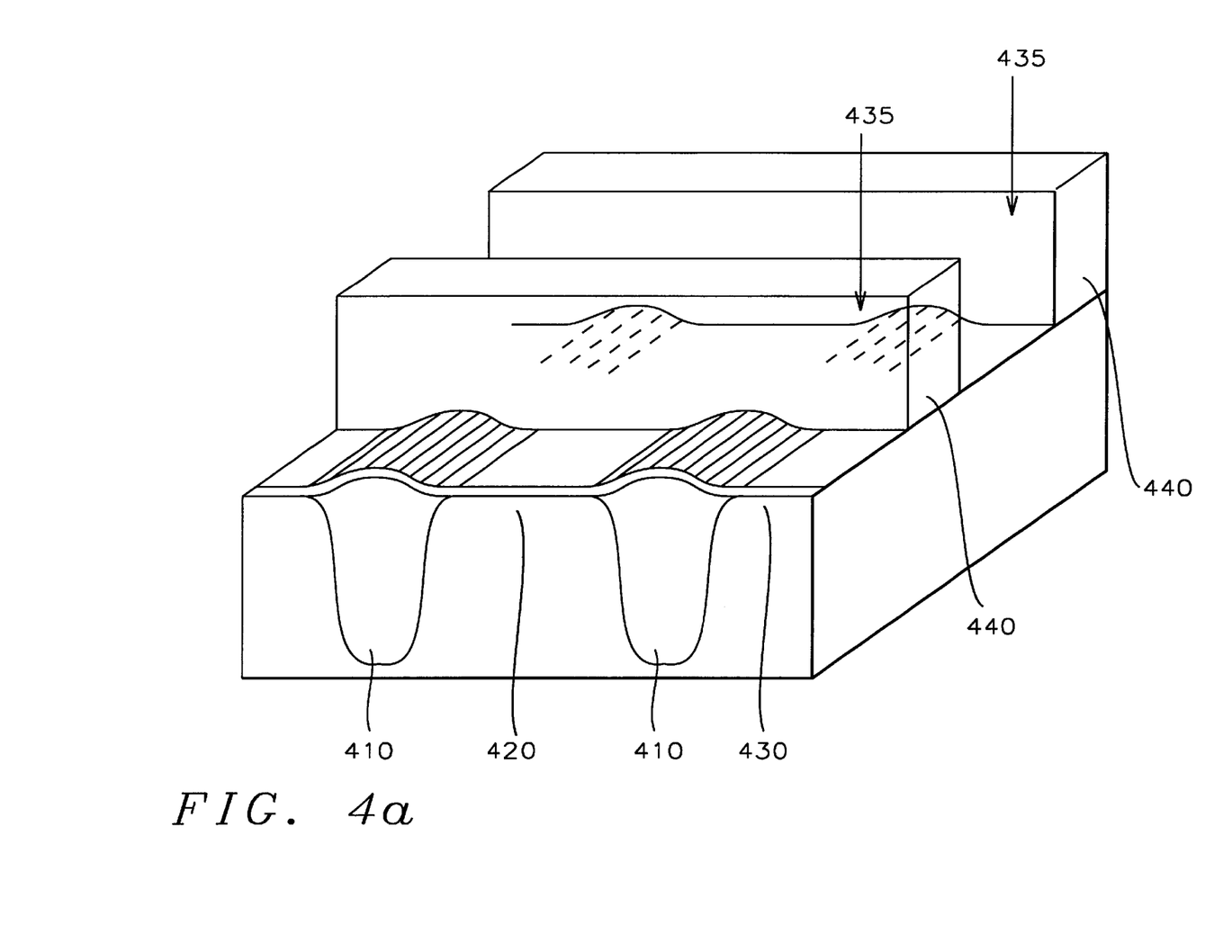
FIG. 4a is an isometric view taken at the 4a—4a section of the substrate of FIG. 3c showing the forming of the damascene-like trench of this invention.

A resulting nitride strip (440) is better seen in the top view shown in FIG. 3c. It will be noted that the areas from which the nitride layer has been removed through patterning, show where the active region (420) and STI (410) are located on substrate (400), as seen from above. To further aid in the conceptualization of the relative portions of the various sections of the substrate, an isometric view, taken at 4a—4a in FIG. 3c, is shown in FIG. 4a.

Figure 4B:
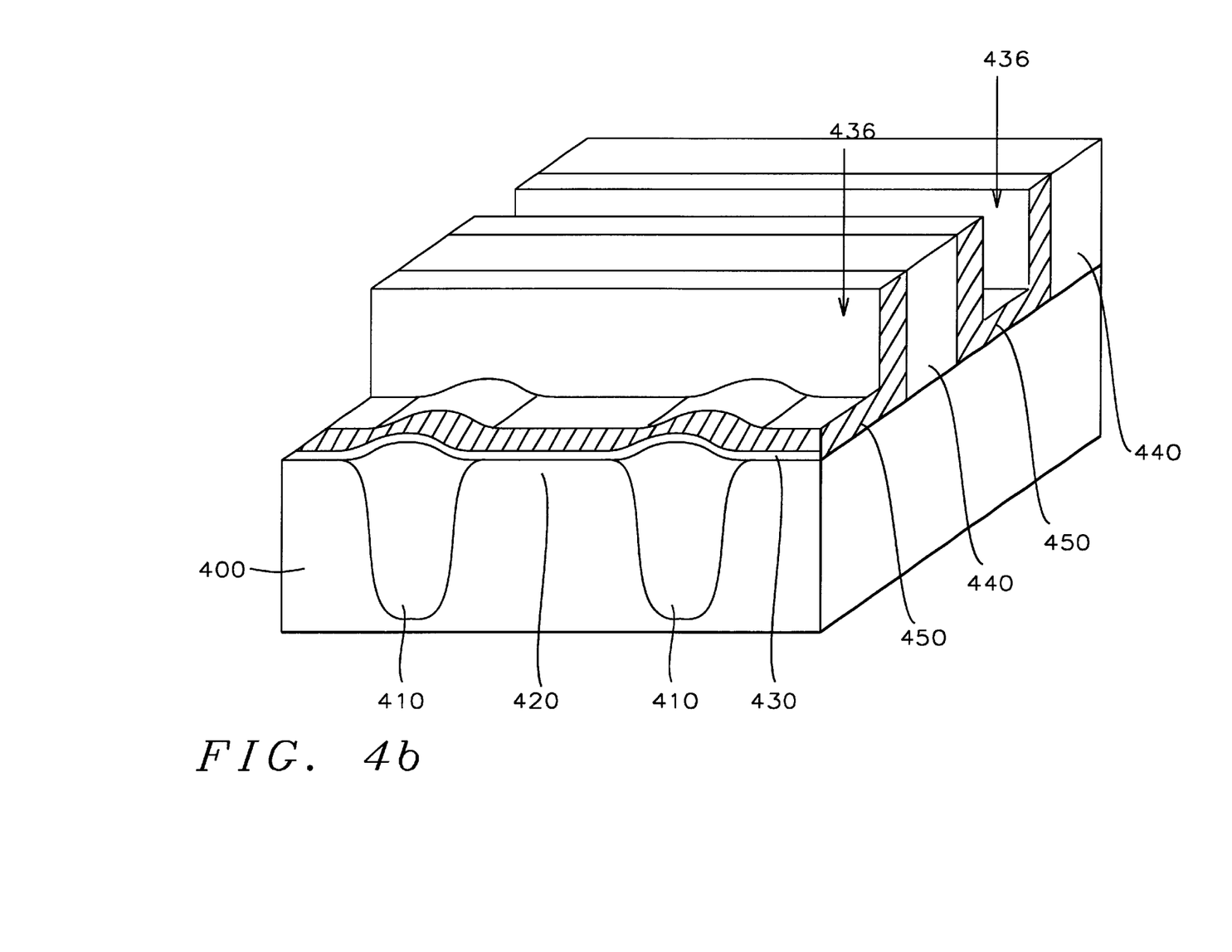
FIG. 4b is an isometric view taken at the 4b—4b section of the substrate of FIG. 3d showing the forming of the first polysilicon layer of the present invention.

A main feature and key aspect of the present invention is the trench region (435) shown in between nitride strips (440). It is in this region that the damascene-like stacked gate of this invention fill be formed. Thus, a first polysilicon layer is formed over the substrate, including the damascene trench (435) and then either etched-back or polished until nitride layer is reached as shown in the top view of FIG. 3d. The polysilicon layer covers the inside walls of trench (435) conformally, and more importantly, covers the bottom of the trench including the raised topography of the isolation regions below, as better seen in the isometric view shown in FIG. 4b. That is, first polysilicon layer (450) conformally replicates the topography of the underlying tunnel oxide layer (430), as seen in FIG. 4b. As a result, the coupling area between floating gate (450) and substrate (400) is increased, which in turn enhances the programmability of the flash memory cell of this invention.

The polysilicon layer can be formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials. Preferably, it is formed through an LPCVD method employing silane $SiH_4$ as a silicon source material at a temperature range between about 500 to 800° C. The preferred thickness is between about 500 to 5000 angstroms (Å).

Figure 4C:
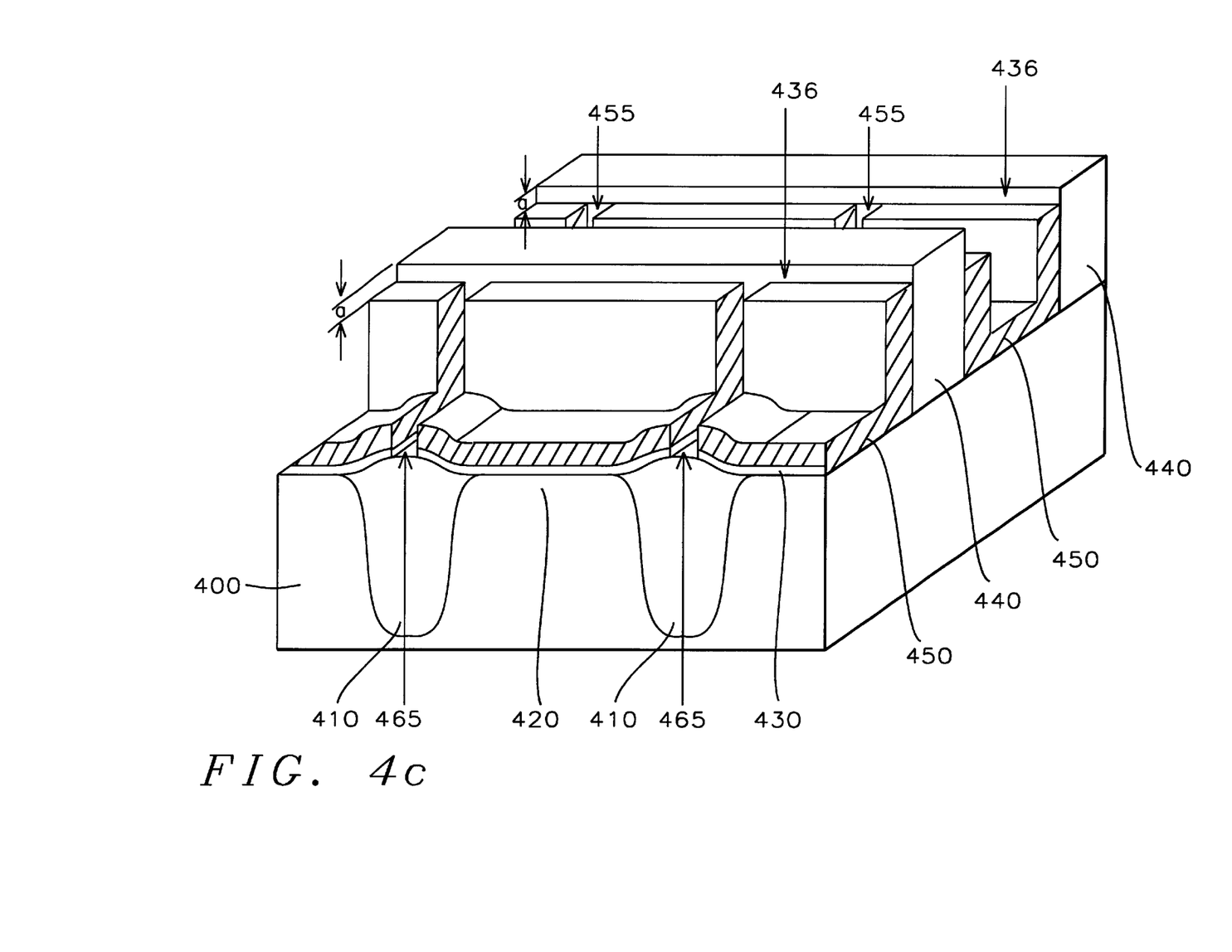
FIG. 4c is an isometric view taken at the 4c—4c section of the substrate of FIG. 3e showing the defining of the floating gate of the damascene-like stacked gate of the present invention.

Any excess first polysilicon layer over the substrate is removed from the substrate by chemical-mechanical polishing (CMP), until nitride layer (440) is reached. Thus, polysilicon layer (450) is level with the surface of the nitride layer, as seen in FIG. 4b. As another key aspect of the present invention, the level of the first polysilicon layer is lowered from that of the level of the nitride level by first forming a poly-oxide layer (not shown) over the polysilicon. This can also be accomplished by performing poly etch-back. However, it is preferred that wet oxidation be used at a temperature between about 600 to 900° C., to form poly-oxide and then remove it by a wet-dip comprising HF solution. Consequently, the level of the first polysilicon is lowered by an amount (a) as shown in FIG. 4c. It is preferred that (a) is between about 100 to 2000 Å.

Figure 3E:
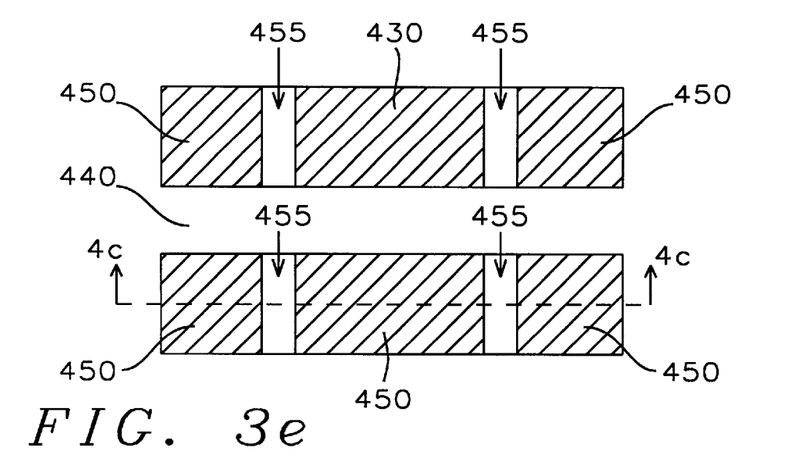
FIG. 3e is a top view of a semiconductor substrate showing the defining of the first polysilicon layer of FIG. 3d, according to the present invention.

The floating gate of the present invention is next defined by patterning the first polysilicon layer, as shown in FIG. 3e. An isometric view is also shown in FIG. 4c which is taken at section 4c—4c of FIG. 3e. Floating gate (450) is defined by delineations (455) shown in FIG. 4c. It will be noted that the etching of the poly takes place over the isolation regions (410) and not over the active regions, (420), so that no damage is parted on the active regions.

Having formed the floating gate in the damascene-like trench of the invention, the next step is to form an intergate or inter-poly layer to serve as the capacitive dielectric between the floating gate and the control gate to be formed. An oxide, a nitrided oxide (oxynitride) or a reoxidized oxide (ONO) can be used for this purpose. An oxynitride film (460), with a thickness between about 50 to 500 Å, is preferred by nitridizing a thermal oxide layer through annealing the oxide layer with dilute $NH_3$ using $N_2$ or Ar as a carrier gas at an elevated temperature between about 800 to 1200° C.

Figure 3F:
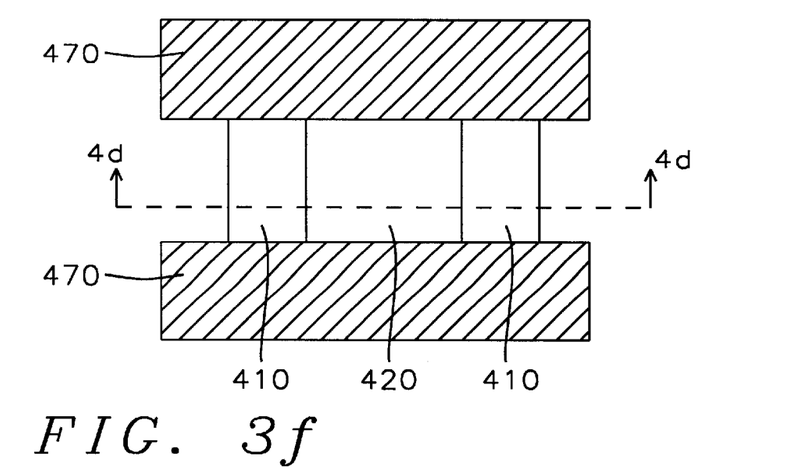
FIG. 3f is a top view of a semiconductor substrate showing the forming and chemical-mechanical polishing of the second polysilicon layer formed over the substrate of FIG. 3c, according to the present invention.
Figure 4D:
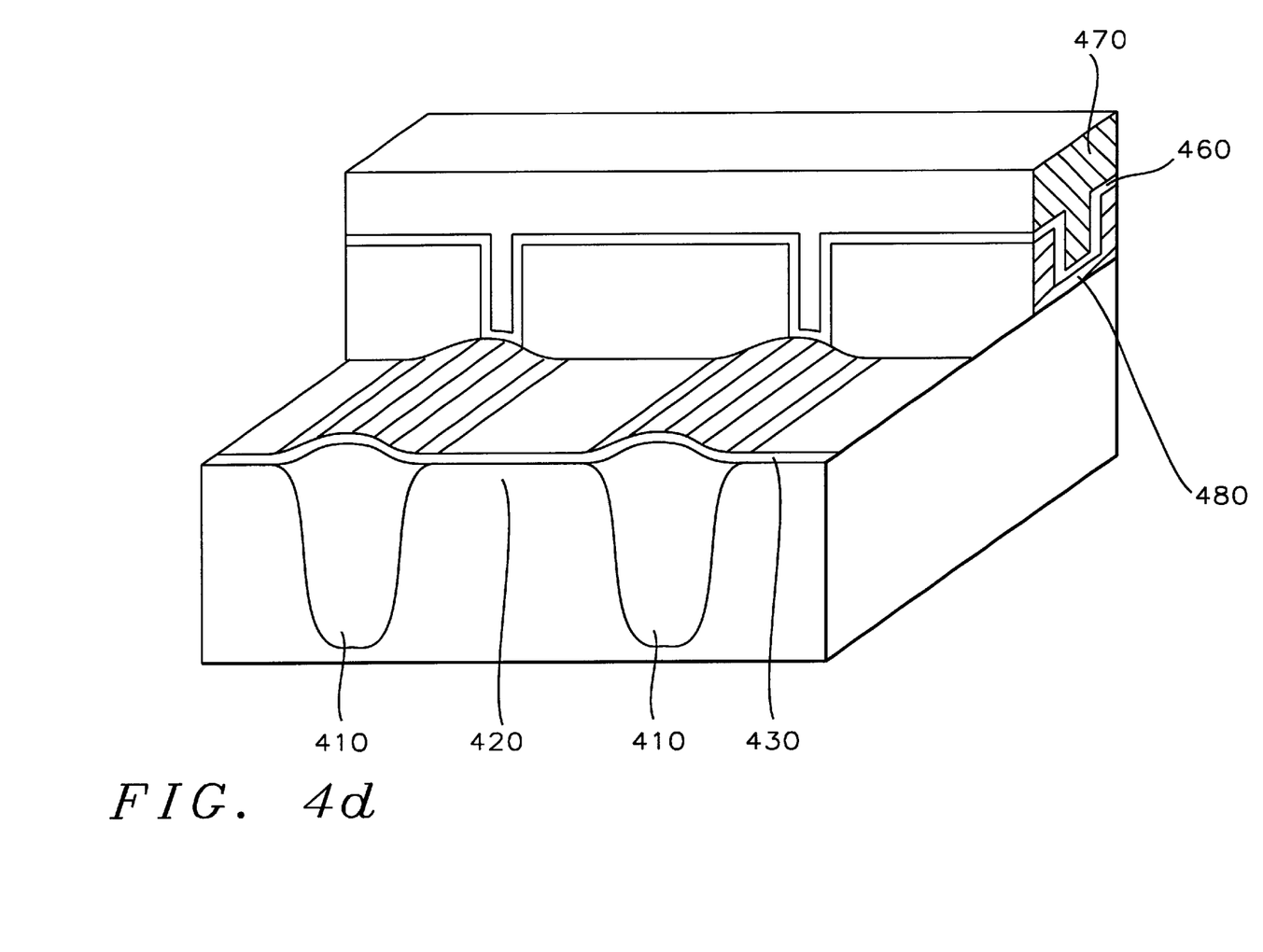
FIG. 4d is an isometric view taken at the 4d—4d section of the substrate of FIG. 3f showing the forming of the inter-gate dielectric and the control gate of the damascene-stacked gate of this invention.

As a penultimate step to forming the damascene-like stacked gate of the disclosed flash memory cell of this invention, second polysilicon layer (470) is formed over the inter-poly layer as shown in FIG. 4d, which is an isometric view taken at section 4d—4d of FIG. 3f. FIG. 4d shows the stacked gate, including floating gate (450) and control gate (470), after the removal of nitride strips (440). The nitride removal is accomplished by a wet-etch recipe comprising hot phosphoric solution. Nitride layer is used as an etch stop for the chemical-mechanical polishing of the second polysilicon layer.

While the invention has been particularly shown and described with reference to the preferred embodiments thereof, it will be understood by those skilled in the art that various changes in form and details may be made without departing from the spirit and scope of the invention.

What is claimed is:

1. A method of forming a flash memory cell having a damascene-like stacked gate comprising the steps of:
   providing a semiconductor substrate;
   forming field oxide or shallow trench isolation (STI) within and on said substrate;
   forming tunnel oxide layer over said substrate including over said (STI);
   forming nitride layer over said tunnel oxide layer; forming damascene-like trench in said nitride layer;
   forming first polysilicon layer in said damascene-like trench to form the floating gate of said flash memory cell;
   forming interpoly dielectric layer over said first polysilicon layer in said damascene-like trench; and
   forming second polysilicon layer over said interpoly layer to form the control gate of said flash memory cell having a damascene-like stacked gate.

2. The method of claim 1, said STI comprises trench isolation oxide having a thickness between about 2000 to 10000 Å.

3. The method of claim 1, wherein said tunnel oxide has a thickness between about 20 to 200 Å.

4. The method of claim 1, wherein said nitride layer has a thickness between about 1000 to 5000 Å.

5. The method of claim 1, wherein said damascene-like trench has a depth between about 1000 to 5000 Å.

6. The method of claim 1, wherein said first polysilicon layer has a thickness between about 1000 to 5000 Å.

7. The method of claim 1, wherein said interpoly dielectric layer comprises oxynitride having a thickness between about 50 to 500 Å.

8. The method of claim 1, wherein said second polysilicon layer has a thickness between about 500 to 5000 Å.

9. A method of forming a flash memory cell having a damascene-like stacked gate comprising the steps of:
   providing a semiconductor;
   forming field oxide or shallow trench isolation (STI) within and on said substrate;

forming tunnel oxide layer over said substrate including over said (STI);

forming nitride layer over said tunnel oxide layer;

forming a damascene-like trench in said nitride layer;

forming first polysilicon layer over said substrate including over said damascene-like trench;

performing chemical-mechanical polishing (CMP) of said first polysilicon layer;

forming poly-oxide over said first polysilicon layer over said stacked gate regions;

removing said poly-oxide layer over said first polysilicon layer;

patterning said first polysilicon layer to form a floating gate of said flash memory cell;

forming an inter-poly dielectric layer over said substrate including said floating gate;

forming a second polysilicon layer over said inter-poly dielectric layer to form a control gate of said flash memory cell;

performing chemical-mechanical polishing (CMP) of said second polysilicon layer until said nitride layer is reached; and removing said nitride layer.

10. The method of claim 9, wherein said STI comprises trench isolation oxide having a thickness between about 2000 to 10000 Å.

11. The method of claim 9, wherein said tunnel oxide is thermally grown at a temperature between about 600 to 1200° C. having a thickness between about 20 to 200 Å.

12. The method of claim 9, wherein said forming said nitride layer is accomplished by reacting dichlorosilane ($SiCl_2H_2$), or silane ($SiH_4$), with ammonia ($NH_3$) in an LPCVD at a temperature between about 700 to 900° C. having a thickness between about 1000 to 5000 Å.

13. The method of claim 9, wherein said first polysilicon layer is formed with LPCVD method employing silane $SiH_4$ as a silicon source material at a temperature between about 500 to 800° C.

14. The method of claim 9, wherein said first polysilicon layer has a thickness between about 500 to 5000 Å.

15. The method of claim 9, wherein said chemical-mechanical polishing (CMP) of said first polysilicon is performed until underlying said nitride layer is reached.

16. The method of claim 9, wherein said forming said polyoxide layer over said first polysilicon layer is accomplished by wet or dry oxidation of poly.

17. The method of claim 9, wherein said poly-oxide has a thickness between about 100 to 2000 Å.

18. The method of claim 9, wherein said removing said polyoxide layer is accomplished by using a wet-dip etch recipe comprising HF solution.

19. The method of claim 9, wherein said inter-poly dielectric is formed at a temperature between about 800 to 1200° C.

20. The method of claim 9, wherein said inter-poly dielectric layer has a thickness between about 50 to 500 Å.

21. The method of claim 9, wherein said second polysilicon layer has a thickness between about 500 to 5000 Å.

22. The method of claim 9, wherein said removing said nitride layer is accomplished by using recipe comprising hot phosphoric solution.

* * * * *